United States Patent [19]

Vinn et al.

[11] Patent Number: 4,902,984
[45] Date of Patent: Feb. 20, 1990

[54] DIFFERENTIAL AMPLIFIER

[75] Inventors: Charles L. Vinn, Milpitas; John A. Flink, Santa Clara, both of Calif.

[73] Assignee: Raytheon Company, Lexington, Mass.

[21] Appl. No.: 289,296

[22] Filed: Dec. 23, 1988

[51] Int. Cl.$^4$ .............................................. H03F 3/45
[52] U.S. Cl. .................................... 330/252; 330/257
[58] Field of Search ............... 330/252, 253, 255, 257, 330/259, 261, 245, 301; 307/494

[56] References Cited

U.S. PATENT DOCUMENTS

| | | | |
|---|---|---|---|
| 3,668,538 | 6/1972 | Hearn | 330/9 |
| 4,002,993 | 1/1977 | van de Plassche | 330/252 |
| 4,075,575 | 2/1978 | Robe | 330/259 |
| 4,240,040 | 12/1980 | Saari | 330/261 X |
| 4,616,190 | 10/1986 | van de Plassche | 330/261 |
| 4,636,743 | 1/1987 | Cotreau | 330/295 |
| 4,636,744 | 1/1987 | King et al. | 330/295 |

Primary Examiner—Steven Mottola
Attorney, Agent, or Firm—Edmund J. Walsh; Richard M. Sharkansky

[57] ABSTRACT

An improved differential amplifier having circuitry to enhance the slew rate and to provide a means for nulling the offset voltage during fabrication of the amplifier as an integrated circuit. The differential amplifier comprises an input stage connected to a current mirror. A slew rate enhancement circuit injects current into selected points of the circuit when the input voltage exceeds a predetermined threshold. An offset trim circuit injects a selected amount of current into the current mirror to alter the current flow between the input stage and the current mirror, thereby reducing the offset voltage. The selected amount of current is dictated by diodes which may be permanently shorted at various stages during fabrication, both before and after the amplifier is enclosed in an IC package.

6 Claims, 4 Drawing Sheets

DIFFERENTIAL AMPLIFIER

BACKGROUND OF THE INVENTION

This invention relates generally to linear amplifiers and more specifically to improving the performance of integrated circuit differential amplifiers.

Differential amplifiers are well known in the electronic art and are commercially available in integrated circuit (IC) packages. A typical package might have eight output pins: two for the input, one for the output, two for power connections, two for nulling the offset voltage, and one pin not connected to the circuit but included to provide an even number of pins.

The difference between signals applied to the input pins appears amplified at the output pin. Ideally, the signal at the output pin would change instantaneously in response to changes of the signals at the input pins. Components throughout the amplifier, however, have capacitance associated with them. For voltage across the components to change, current must flow to either charge or discharge those capacitances. The speed at which the output can change in response to changes at the inputs is therefore limited by the capacitance and the amount of current which flows.

The maximum rate at which the output can change in response to changes in the input is called the "slew rate". A high slew rate is desirable in many applications. In particular, where the differential amplifier must respond to rapid changes in the input signals, a high slew rate is very important. For this reason, differential amplifiers are often characterized by their slew rates.

Another characteristic of a differential amplifier is its offset voltage. Ideally, when no input signals are applied, both input pins are at the same voltage (i.e. the difference between the input pins is zero). Variations in fabricating the components of the differential amplifier, however, prevent perfect alignment of the input voltages. If the offset voltage is not corrected, incorrect output signals can result.

The nulling pins can be used to bring the input voltages into alignment. A variable resistor can be connected between those nulling pins when the amplifier is used in a circuit. The center tap of the variable resistor is connected to a power supply. Appropriately adjusting the resistor reduces the offset voltage, i.e. the offset voltage is "nulled".

One drawback to nulling the offset voltage using an external resistor is that it is inconvenient for users of differential amplifiers. For instance, electronics manufacturers mass producing products using differential amplifiers can often not afford to null each amplifier. It would be desirable, therefore, to null each amplifier when it is made.

SUMMARY OF THE INVENTION

It is an object of this invention to provide a differential amplifier with an enhanced slew rate.

It is also an object of this invention to provide an improved means to null the offset voltage of a differential amplifier.

The foregoing and other objects of the invention are achieved in a differential amplifier having a differential input stage connected to a current mirror via a first and second lead. A slew rate enhancement circuit, responsive to the input signal, injects current into the first lead of the current mirror when the input voltage exceeds a positive threshold and into the second lead of the current mirror when the input voltage falls below a negative threshold. The slew rate enhancement circuit also injects current into the gain stages of the amplifier when the input signal exceeds the positive threshold. The injected currents from the slew rate enhancer provide additional current to charge and discharge circuit capacitance which in turn improves the slew rate.

According to another feature of the invention, an offset trim circuit also injects current into the first and second leads of the current mirror in an amount selected to reduce the offset voltage. The offset trim circuit has a first set of diodes connected to test pads which are adapted to be permanently shorted by test equipment connected to the test pads. The offset trim circuit has a second set of diodes connected, via isolating components, to pins of the IC package. Selected ones of the diodes of the second set may be permanently shorted by test equipment connected to pins of the package.

BRIEF DESCRIPTION OF THE DRAWINGS

For a more complete understanding of this invention, reference is now made to the following description of a preferred embodiment of this invention, as illustrated in the accompanying drawings, in which.

DESCRIPTION OF THE PREFERRED EMBODIMENTS

Figure 1:
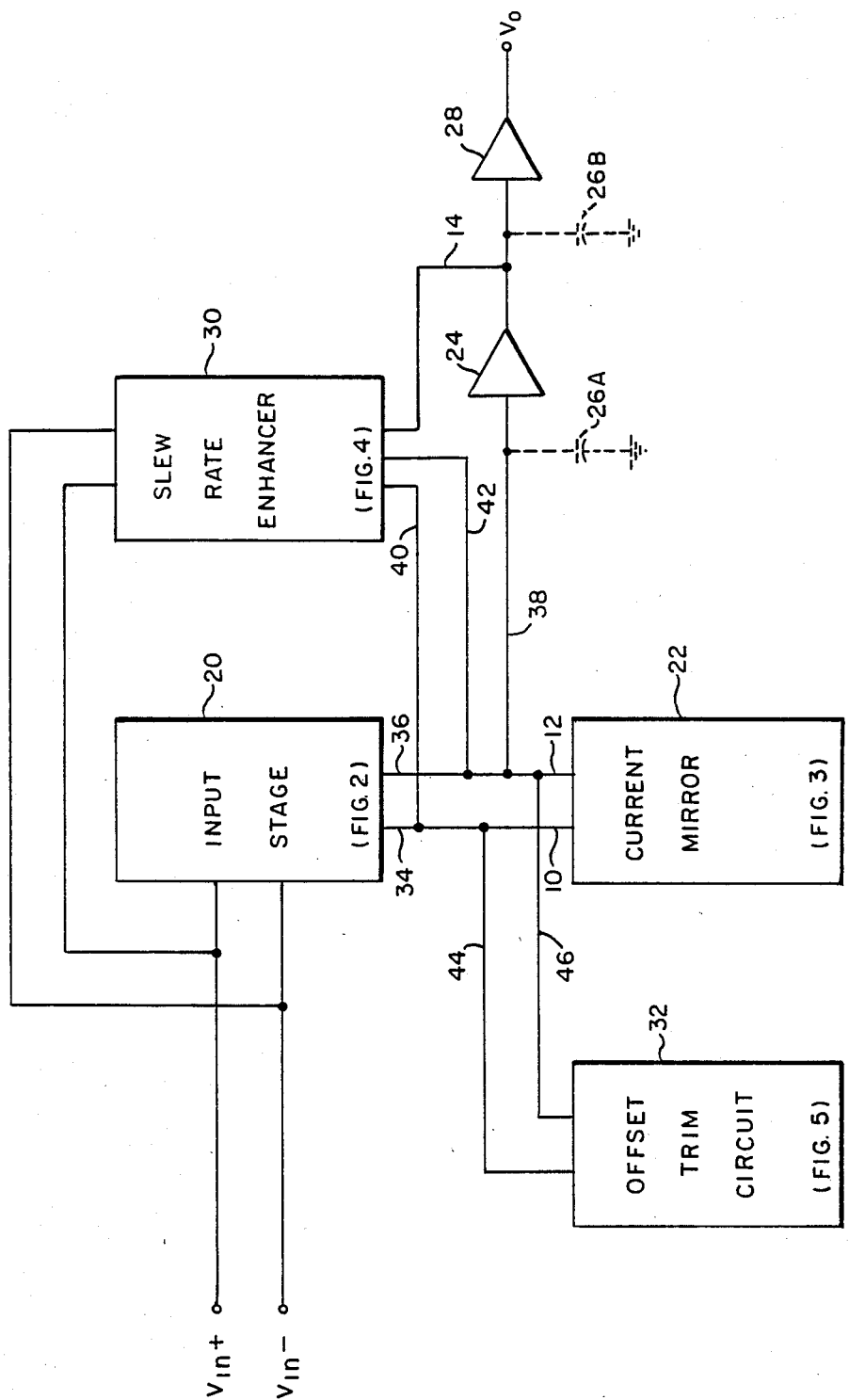
FIG. 1 is a block diagram of a differential amplifier fabricated according to this invention.

Referring now to FIG. 1, a block diagram of a differential amplifier constructed according to the present invention is seen. Input signals are applied to the terminals $V_{in+}$ and $V_{in-}$. Since the circuit describes a differential amplifier, the input voltage (hereinafter "$V_{in}$") is the difference between $V_{in+}$ and $V_{in-}$. The output appears at terminal $V_o$. For simplicity, power connections, the pins for connecting an external resistor for nulling the offset voltage, and other standard components of differential amplifiers are not explicitly shown.

In operation, when no input signals are applied to terminals $V_{in+}$ and $V_{in-}$, the currents from input stage 20 in leads 34 and 36 are ideally identical. When signals are applied to terminals $V_{in+}$ and $V_{in-}$, input stage 20 changes the currents in leads 34 and 36 in proportion to the input voltage.

Current mirror 22 acts to keep the current flowing on its input leads 10 and 12 equal. When an input voltage is applied at terminals $V_{in+}$ and $V_{in-}$ to create unequal currents in leads 34 and 36, current flow through lead 38 equalizes the current flow in leads 10 and 12 into current mirror 22. For example, if $V_{in+}$ (herein the voltages at terminals $V_{in+}$ and $V_{in-}$ will also be referred to simply as $V_{in+}$ and $V_{in-}$) is greater than $V_{in-}$, current flow in lead 36 exceeds current flow in lead 34. To equalize the current flow into leads 10 and 12, the additional current flows into lead 38. A little thought reveals that the current in lead 38 is proportional to the difference in voltages applied at the input terminals $V_{in+}$ and $V_{in-}$.

The current flow through lead 38 provides an input to gain stage 24. Here, gain stage 24 is an amplification stage such as might be found in known differential amplifiers. Gain stage 24 is in turn connected to a buffer stage 28, also of known construction, which provides the output signal at terminal $V_o$.

The slew rate of the amplifier in FIG. 1 is limited by the capacitance associated with the various components. Significantly, the capacitances of gain stage 24 and of buffer stage 28 contribute appreciably to any decrease in the slew rates. For purposes of illustration, those capacitances are represented by imaginary capacitors 26A and 26B. The slew rate of the differential amplifier is therefore limited by how quickly current can be supplied to charge or discharge capacitors 26A and 26B in response to changes at the inputs.

Slew rate enhancer 30 operates to supply additional current to charge or discharge capacitors 26A and 26B in response to relatively large changes in the input. When $V_{in+}$ exceeds $V_{in-}$ by a threshold amount, $V_p$, slew rate enchancer 30 supplies current on leads 42 and 14 to charge capacitors 26A and 26B. The current on lead 42 flows into lead 38 and charges capacitor 26A because current mirror 22 prevents that current from flowing into lead 12. When $V_{in-}$ exceeds $V_{in+}$ by the threshold $V_p$, slew rate enhancer 30 supplies current on lead 40. The increase in current on lead 40 increases the current on lead 10. Current mirror 22 operates to equalize the currents on leads 10 and 12. Increasing the current in lead 12 allows current to flow out of capacitor 26A through lead 38 and into the current mirror through lead 12. No path is provided to discharge capacitor 26B when $V_{in-}$ exceeds $V_{in+}$ because that capacitor discharges much more quickly than it charges.

The differential amplifier of FIG. 1 also allows nulling of the offset voltage. If the components used to construct input stage 20 all have identical current versus voltage characteristics, equal currents in leads 34 and 36 would result in equal voltages at terminals $V_{in+}$ and $V_{in-}$. However, there can be significant variations in the current versus voltage characteristics from device to device even when the devices are fabricated on the same IC wafer. Offset trim circuit 32 may be adjusted to minimize the effect of any differences in devices.

In a manner to be explained in more detail below, offset trim circuit 32 outputs current on lead 44 or 46. A little thought will reveal that, due to the operation of current mirror 22 keeping current through lead 12 equal to current through lead 10, increased current on lead 44 increases current on lead 36. Conversely, current on lead 46 decreases current on lead 36. The difference in current on leads 34 and 36 compensates for differences in the current versus voltage characteristics of devices in input stage 20 to make the voltages at terminals $V_{in+}$ and $V_{in-}$ equal. Thus, currents on leads 44 and 46 null the offset at the input terminals. During fabrication of the IC differential amplifier, offset trim circuit 32 is set to produce the desired current on leads 44 and 46.

Figure 2:
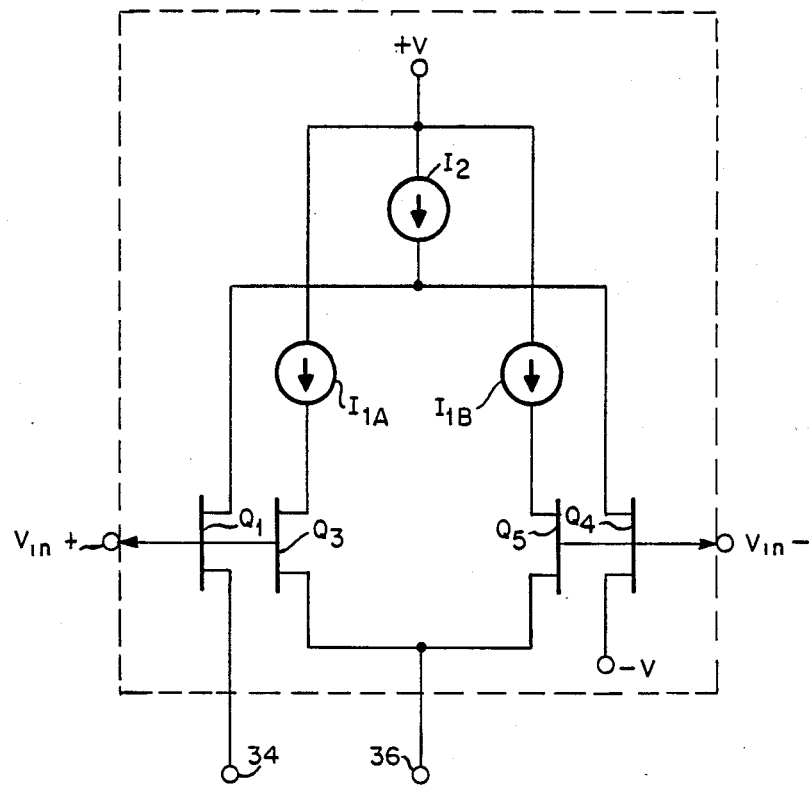
FIG. 2 is a schematic, greatly simplified, of the input stage of the amplifier in FIG. 1.

Turning now to FIG. 2, additional details of input stage 20 can be seen. Terminal $V_{in+}$ is connected to the gates of field effect transistors (FET) $Q_1$ and $Q_3$. Terminal $V_{in-}$ is connected to the gates of FETs $Q_4$ and $Q_5$. Constant current sources $I_{1A}$, $I_{1B}$, and $I_2$ are fabricated from discrete components using known methods. Here, constant current sources $I_{1A}$ and $I_{1B}$ are designed to provide the same amount of current, on the order of a few tenths of a milliAmp. Constant current source $I_2$ is designed to provide four times the current of $I_{1A}$ or $I_{1B}$. The sources are powered by connections to the positive supply $+V$ and the negative supply $-V$.

The current through $Q_3$ and $Q_5$ is equal to the current of the constant current sources $I_{1A}$ and $I_{1B}$, respectively. The sum of those currents on lead 36 is therefore always constant and is equal to $I_{1A}+I_{1B}$ (herein, the current through a constant current source will be referred to by the same designation as the constant current source). The current in lead 34 is equal to the current through FET $Q_1$. When no voltage is applied to terminal $V_{in+}$ or $V_{in-}$, the current through FET $Q_1$ ideally equals the current through FET $Q_4$. A little thought reveals the current through FET $Q_1$ is one-half $I_2$, which equals $I_{1A}+I_{1B}$. Thus, the current on lead 34 equals the current on lead 36 when $V_{in+}$ equals $V_{in-}$. According to the small signal model of transistors, when $V_{in+}$ exceeds $V_{in-}$, $I_2$ divides in proportion to the difference between $V_{in+}$ and $V_{in-}$ such that more current flows through FET $Q_1$ then through FET $Q_2$. Thus, the current on lead 34 exceeds the current on lead 36. Conversely, when $V_{in-}$ exceeds $V_{in+}$, the current through FET $Q_4$ exceeds the current through FET $Q_1$ and the current on lead 36 exceeds the current on lead 34. Thus, it can be seen that the circuit of FIG. 2 functions as an input stage 20 as described above.

Figure 3:
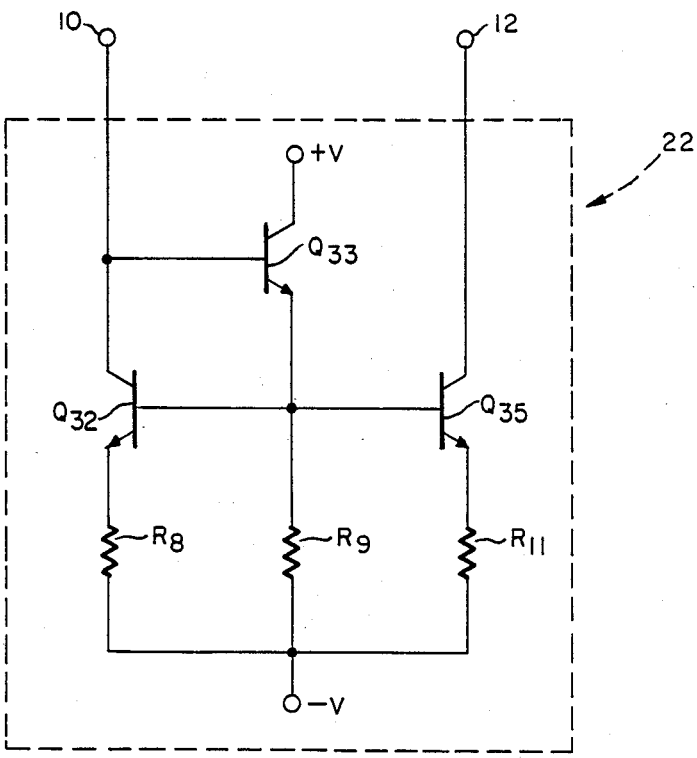
FIG. 3 is a schematic, greatly simplified, of the current mirror of the amplifier in FIG. 1.

Turning now to FIG. 3, details of current mirror 22 can be seen. The circuit is constructed from bipolar junction transistors (BJTs) using known techniques. Here, the bases of BJTs $Q_{32}$ and $Q_{35}$ are connected together and are at the same voltage. The emitters are connected to the negative supply, $-V$, through resistors $R_8$ and $R_{11}$, which have the same resistance. A little thought reveals that if BJTs $Q_{32}$ and $Q_{35}$ have substantially equal voltage versus current characteristics, the currents through BJTs $Q_{32}$ and $Q_{35}$ will be equal. If the current on lead 10 increases, the base current of BJT $Q_{33}$ will increase, causing an increase in base voltages and base currents of BJTs $Q_{32}$ and $Q_{35}$. Thus, an increase in current of lead 10 is "mirrored" by an increase of current in lead 12. Thus, the circuit in FIG. 3 performs the function of current mirror 22 described above.

Figure 4:
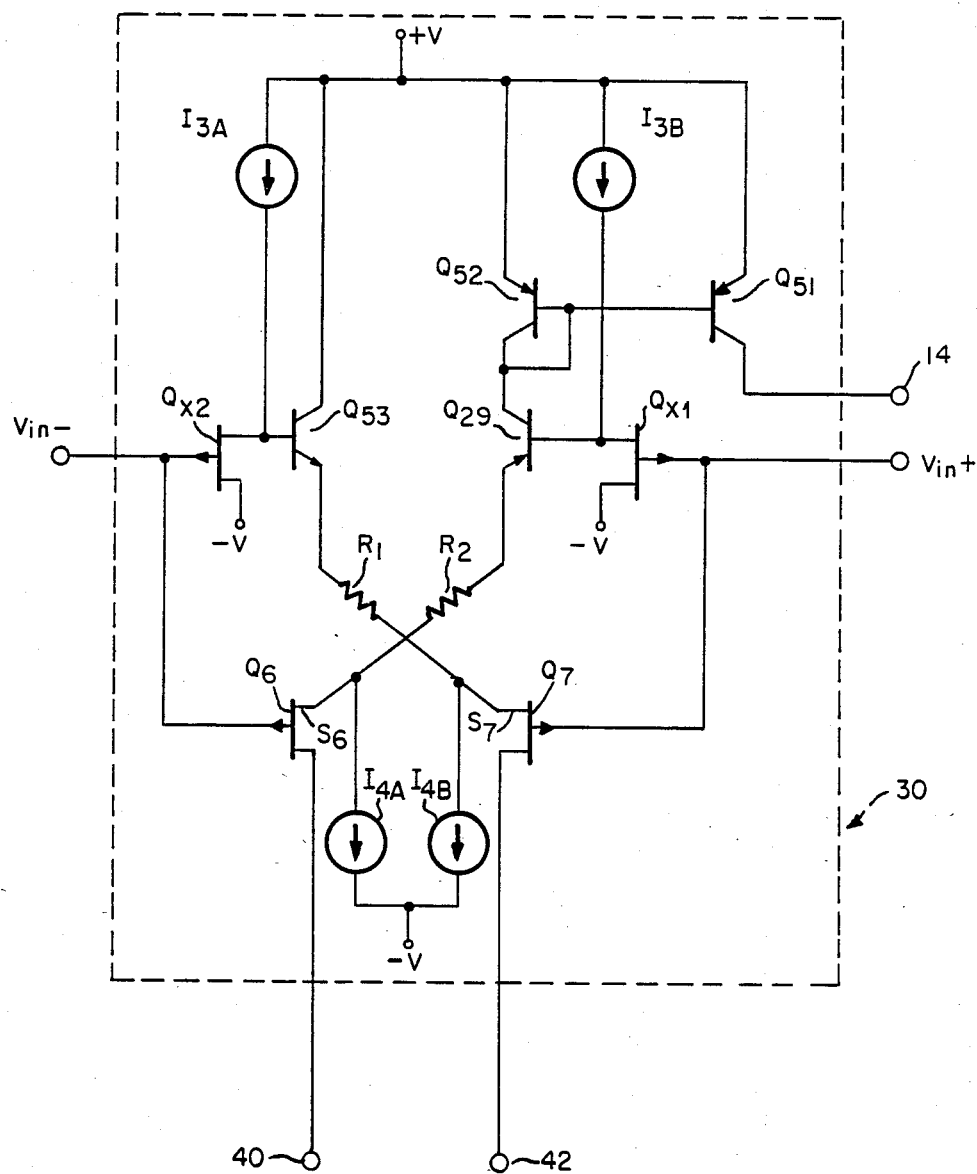
FIG. 4 is a schematic, greatly simplified, of a circuit to enhance the slew rate of the amplifier in FIG. 1.

Turning now to FIG. 4, additional details of slew rate enchancer 30 can be seen. FETs $Q_6$ and $Q_7$ can be thought of as switches which prevent current from flowing through leads 40 and 42 when $V_{in-}$ and $V_{in+}$ are below the threshold $V_p$. As is known, FETs conduct no current when their gate to source voltages are below a pinchoff voltage, which is equal to the threshold $V_p$. Thus, slew rate enhancer 30 has no effect on the rest of the differential amplifier when the inputs are below $V_p$.

A little thought will reveal that FET $Q_{x2}$ and constant current source $I_{3A}$ make a source follower amplifier to buffer $V_{in-}$ as it is applied to the base of BJT $Q_{35}$. Likewise, FET $Q_{x1}$ and constant current source $I_{3B}$ buffer $V_{in+}$ as it is applied to the base of BJT $Q_{29}$. Constant current sources $I_{3A}$ and $I_{3B}$ here provide the same amount of current, on the order of 0.2 mA.

Since FETs $Q_{x1}$ and $Q_{x2}$ act as source followers, $V_{in+}$ and $V_{in-}$ are applied to the bases of BJTs $Q_{53}$ and $Q_{29}$. The current through resistor $R_2$ might then be calculated to equal $$(V_{in+}+V_{gsx1}-V_{BE29}-(V_{in-}+V_{gs6}))/R_2 \approx V_{in}/R_2 \qquad \text{EQ. (1)}$$

where $V_{GSx1}$ = the gate to source voltage of FET $Q_{x1}$;
$V_{BE29}$ = the base to emitter voltage of BJT $Q_{29}$;
$V_{GS6}$ = the gate to source voltage of FET $Q_6$; and
$V_{in} = V_{in+} - V_{in-}$.

Thus, the current through resistor $R_2$ is proportional to $V_{in}$.

The current flowing through lead 40 can therefore be calculated. As described above, when $V_{in+}$ exceeds $V_{in-}$ by at least $V_p$, the current through resistor $R_2$ flows in part through FET $Q_6$. Part of the current through resistor $R_2$ flows through constant current source $I_{4A}$. Here, $I_{4A}$ is designed to pass a constant current of $I_{4A} = V_p/R_2$. Using EQ. (1), the current through FET $Q_6$ approximately equals $V_{in}/R_2 - V_p/R_2 = (V_{in} - V_p)/R_2$ when $V_{in} > V_p$ and equals 0 when $V_{in} < V_p$.

Due to the symmetry of the circuit in FIG. 4, a little thought will reveal that lead 42 has a current of $(V_{in} - V_p)/R_2$ when $-V_{in} > V_p$ and equals 0 when $-V_{in} < V_p$.

In summary then, when $V_{in}$ is between $-V_p$ and $+V_p$, slew rate enhancer 30 does not provide current on lead 40 or lead 42. When $V_{in}$ equals $-V_p$, slew rate enhancer 30 begins to provide current on lead 42, and the magnitude of that current increases as $V_{in}$ becomes more negative. When $V_{in}$ equals $V_p$, slew rate enhancer 30 begins to provide current on lead 40, and the magnitude of that current increases as $V_{in}$ becomes more positive. Here the threshold $V_p$ is selected to equal the input voltage at which input stage 20 (FIG. 1) saturates, the current provided by slew rate enhancer 30 compensates for the saturation of input stage 20.

One additional feature of slew rate enhancer 30 can be seen by reference to FIG. 4. Namely, the current on lead 14 equals the current through resistor $R_2$. As can be seen, the bases of BJTs $Q_{52}$ and $Q_{51}$ are connected together as are their emitters. Therefore, the current through BJT $Q_{52}$ should equal the current through BJT $Q_{51}$. Since the current through BJT $Q_{52}$ flows through resistor $R_2$, the current through BJT $Q_{52}$, and hence the current through BJT $Q_{51}$ and lead 14, equals the current through $R_2$. Since lead 14 is connected to capacitor 26B (FIG. 1), slew rate enhancer 30 provides current to charge capacitor 26B (FIG. 1) as $V_{in+}$ exceeds $V_{in-}$.

Figure 5:
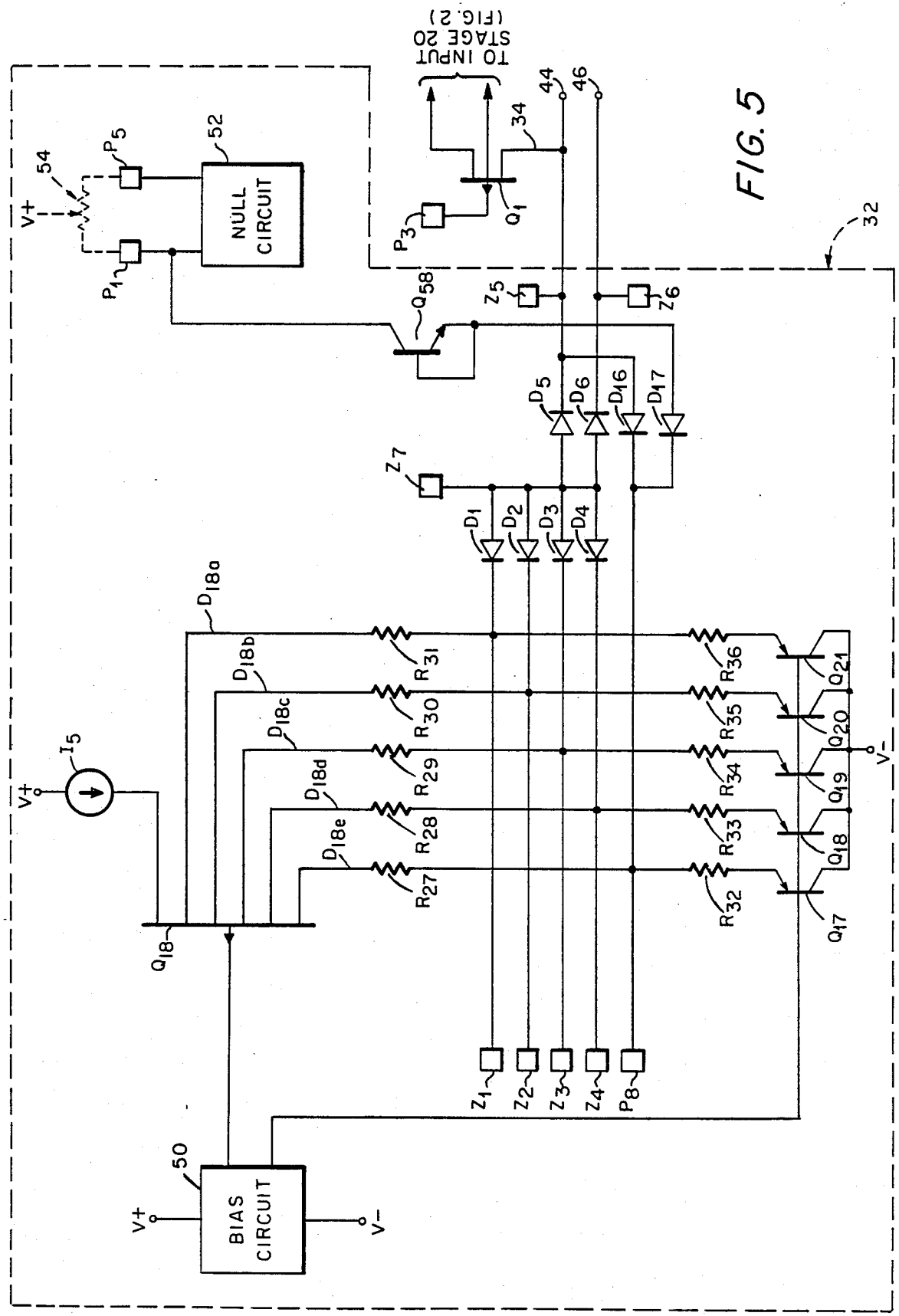
FIG. 5 is a schematic, greatly simplified, of a circuit allowing nulling of the offset voltage of the amplifier of FIG. 1.

Turning now to FIG. 5, additional details of offset trim circuit 32 can be seen. As described above, trim circuit 32 provides current on leads 44 and 46 to null the offset voltage.

Part of the nulling, called "wafer level trim" is accomplished during fabrication of the IC containing the differential amplifier. As is known in the art, during fabrication before the integrated circuits are sealed into packages, test equipment is connected to the circuit. Here, test pads $Z_1$-$Z_7$ represent pads where test probes can make connection to the circuit. The equipment connected to test pads $Z_1$-$Z_7$ will short out selected ones of the diodes $D_1$-$D_6$ to select the amount of current flowing in leads 44 and 46.

Each of the diodes $D_1$-$D_4$ is connected to FET $Q_{18}$ through one of the resistors $R_{27}$-$R_{31}$. Here, FET $Q_{18}$ is configured as a multidrain current source. As is known, FET $Q_{18}$ operating as a multidrain current source divides the current supplied by constant current source $I_5$ to flow out of drains $D_{18a}$-$D_{18e}$. The dimensions of FET $Q_{18}$ are selected so that the current in drains $D_{18a}$-$D_{18e}$ are in the ratios of 16:8:4:2:1, i.e. the drains have a binary weighting. Because each diode $D_1$-$D_4$ is connected to a different one of the drains of FET $Q_{18}$, each diode $D_1$-$D_4$ shorted out will provide a different amount of current to the node connected to test pad $Z_7$. By selecting appropriate combinations of the diodes $D_1$-$D_4$, sixteen different values of current could be provided to the node connected to test pad $Z_7$.

By shorting diode $D_5$, the selected current at the node connected to test pad $Z_7$ is directed to lead 44. Conversely, by shorting diode $D_6$, that current is directed to lead 46. As described above, adding current on lead 44 increases the voltage at terminal $V_{in-}$ (FIG. 1) relative to the voltage at $V_{in+}$ (FIG. 1). Conversely, adding current on lead 46 increases the voltage at terminal $V_{in+}$ (FIG. 1) relative to terminal $V_{in-}$ (FIG. 1). Thus, the offset voltage can be nulled by shorting diodes $D_1$-$D_6$, and the ability to null the offset voltage is limited only by the ability to select a combination of diodes which produce the desired nulling.

It should be noted that bias circuit 50 biases the gate of FET $Q_{18}$ to ensure the device conducts the required current. Here, bias circuit 50 is constructed in any known manner. Additionally, bias circuit 50 provides a bias voltage to the bases of BJTs $Q_{17}$-$Q_{21}$. The bases of those transistors are biased to a sufficient level that diodes $D_1$-$D_4$ are reversed biased, unless they have been shorted out.

Diodes $D_{16}$ or $D_{17}$, if shorted out, would connect drain $D_{18e}$ to either lead 44 or 46. For reasons to be described below, diodes $D_{16}$ and $D_{17}$ provide a means to make a slight adjustment to the current in leads 44 and 46 and thereby to make a slight adjustment in the offset voltage.

In operation, selected ones of the diodes $D_1$-$D_6$, and $D_{16}$ and $D_{17}$ are shorted out at the factory where the IC differential amplifiers are made. As is known, before IC's are sealed inside packages, test equipment (not shown) makes a connection to bonding pads and test pads. Bonding pads are metalized regions on the IC where bond wires are attached. The bond wires make connections to pins on the outside of the IC packages. Thus, the input terminals $V_{in+}$ and $V_{in-}$, the power supplies V+ and V−, the two nulling inputs and the output terminal have bonding pads associated with them. Test pads, such as test pads $Z_1$-$Z_7$, are metalized regions like bonding pads. They are connected to the circuit, but not to pins on the IC package.

To determine which diodes to short, the test equipment connects input terminal $V_{in-}$ to ground, forces the output voltage to zero using well-known testing techniques, and measures the voltage at terminal $V_{in+}$. The test equipment supplies power to the circuit via connections to the bonding pads connected to supply terminals V+ and V− so that FET $Q_{18}$ produces the desired current flow in drains $D_{18a}$-$D_{18e}$. A little thought will reveal that the test equipment can simulate the effect of shorting any diode $D_1$-$D_4$ by making connections between test pads $Z_1$-$Z_4$ and test pad $Z_7$. Likewise, the test equipment can simulate the effects of shorting diodes $D_5$ or $D_6$ by making connections between test pad $Z_5$ or $Z_6$ and test pad $Z_7$. The simplest way to determine which diodes to short is for the test equipment to ground the input terminal $V_{in-}$ and measure the voltage at input terminal $V_{in+}$ (i.e. the offset voltage). The test equipment then runs through the possible combinations of shorts and opens the diodes $D_1$-$D_6$ (32 combinations in all since only one of the pair $D_5$ and $D_6$ is shorted). The combination producing the value of voltage closest to zero is selected and those diodes are permanently shorted.

The diodes are permanently shorted by a technique sometimes called "zapping". Basically, each diode consists of a region of n-type semiconductor adjacent to a region of p-type material. Metal contacts, usually aluminum, are made to the regions. To zap a diode, the diode is reverse biased to approximately 20 V and a 500 mA current pulse lasting approximately 100 ms is created. For diodes which are relatively small, the current pulse is large enough to cause migration of aluminum from the metal pad over the n-type region to the p-type region. The junction between the n-type and p-type region is thereby shorted out.

For example, to short out diode $D_1$, the test equipment applies 20 V between test pads $Z_7$ and $Z_1$. The resulting current pulse zaps the diode. Resistors $R_{27}$-$R_{31}$, having values approximately 1 k ohms, protect FET $Q_{18}$ during the zapping. Likewise, resistors $R_{32}$-$R_{36}$ protect BJTs $Q_{17}$-$Q_{21}$ during the zapping. Diode $D_5$ or $D_6$ is then zapped by pulses applied at test pads $Z_7$ and $Z_5$ or $Z_6$.

Once diodes $D_1$-$D_6$ are zapped, the bonding pads are connected to the pins of a package and the IC is enclosed in the package. Once the IC is enclosed in the package, the test pads can no longer be used for zapping diodes to adjust the offset. However, the process of sealing the IC chip in the package or the presence of bonding wires may change the offset such that additional adjustment is required.

After packaging, the only access to the circuitry is through the external pins on the package. Where the IC is enclosed in an eight pin package, there is typically one pin which is not used. In FIG. 5, bonding pad $P_8$ is connected to diodes $D_{16}$ and $D_{17}$ and is connected to the unused pin. Thus, there is access to one end of diodes $D_{16}$ and $D_{17}$ to provide further nulling, but at least two more pins are required to access the other sides of diodes $D_{16}$ and $D_{17}$. Since the remaining seven pins of an eight pin package are needed for other connections, there are apparently no available pins for zapping diodes $D_{16}$ and $D_{17}$. However, FIG. 5 shows that diodes $D_{16}$ and $D_{17}$ can be zapped by multiple connections to two pins.

As shown in FIG. 5, one side of diode $D_{16}$ is connected to bonding pad $P_3$ via FET $Q_1$. Here, FET $Q_1$ is normally a part of input stage 20 (FIG. 2) and bonding pad $P_3$ is normally used to connect input terminal $V_{in+}$ (FIG. 2) to a pin on the package. During the zapping at the factory, a large voltage is connected between the pin connected to bonding pad $P_8$ and the pin connected to bonding pad $P_3$. The connection from bonding pad $P_3$ to diode $D_{16}$ passes through the gate to drain junction of FET $Q_1$, which acts as a forward biased diode. Furthermore, FET $Q_1$ is much larger than diode $D_{16}$ so that metal migration on the contacts of FET $Q_1$ does not cause metal to bridge any junctions of the device.

Diode $D_{17}$ can be zapped by applying a voltage between the pins connected to bonding pads $P_1$ and $P_8$. Bonding pad $P_8$ as described above, is connected to the normally unused pin of the package. Bonding pad $P_1$ is normally used for offset nulling of the differential amplifier in a circuit. For example, an end user of the IC might connect a variable resistor 54 between the pins connected to bonding pads $P_1$ and $P_5$. The center tap of the resistor is connected to the positive voltage supply V+ and adjusted until the offset voltage is nulled. Null circuit 52 inside the differential amplifier responds to the setting of the resistor and nulls the offset in a known manner.

When $D_{17}$ is zapped, variable resistor 54 is not connected. The voltage applied to pads $P_8$ and $P_1$ causes the metal migration which zaps $D_{17}$, but has little effect on BJT $Q_{58}$. During the zapping, BJT $Q_{58}$ is forward biased. Additionally, BJT $Q_{58}$ is much larger than the diode $D_{17}$ such that any metal migration does not short any junctions of BJT $Q_{58}$.

After the zapping, BJT $Q_{58}$ acts as a reverse bias diode to isolate pad $P_1$ from diode $D_{17}$. Thus, there is no problem in using the pin connected to pad $P_1$ for zapping at the factory and for some other purpose when the differential amplifier is incorporated into a circuit. The drain of FET $Q_1$ is, in normal operation, connected via lead 34 to lead 44. Thus, there is no problem in using the pin connected to pad $P_3$ for zapping diodes $D_{16}$ and for some other purpose when the differential amplifier is incorporated into a circuit.

Having described a preferred embodiment of the present invention, other embodiments may now become apparent to persons having ordinary skill in the art. Accordingly, it is understood that the scope of the present invention is limited only by the scope of the appended claims.

What is claimed is:

1. A circuit comprising:
   (a) a first differential amplifier means for providing output current related to a differential input voltage fed to the circuit;
   (b) a second differential amplifier means, including a pair of transistors having control electrodes fed by the differential input voltage, for directing current from a voltage source through a first one or a second one of the pair of transistors to either a first output or a second output selectively in accordance with the polarity of the differential input voltage when the magnitude of the differential input voltage exceeds a predetermined magnitude and for reducing the level of the current passing to the first or second output when the differential input voltage is less than the predetermined magnitude while providing current through the pair of transistors when the magnitude of the input differential voltage is at a level less than the predetermined magnitude; and
   (c) an output stage means for combining the output current provided by the first differential amplifier means and the current passed to the first output or second output of the second differential amplifier means into a composite output current.

2. A circuit comprising:
   (a) a first differential amplifier stage including means for providing output current related to a differential input voltage fed to the circuit;
   (b) a second differential amplifier stage including means, responsive to the differential input voltage, for directing current from a voltage source to either a first output or a second output selectively in accordance with the polarity of the differential input voltage when the magnitude of the differential input voltage exceeds a predetermined magnitude, including: a first pair of transistors having control electrodes fed by the differential input voltage; a second pair of transistors having control electrodes fed by the differential input voltage; and, means for: (1) biasing either a first one or a second one of the second pair of transistors to a conducting condition selectively in accordance with the polarity of the input differential voltage when the magnitude of the differential input voltage exceeds the predetermined threshold level to pass current from the voltage source through one of the first transistors in the first pair of transistors, through the selected one of the transistors in the second pair of transistors, to one of the first or second outputs while providing current through the first pair of transistors when the magnitude of the input differential voltage is at a level less than the predetermined magnitude; and, (2) biasing the transistors in the second pair of transistors to a non-conducting condition to prevent current from the voltage source from passing to the first and second outputs when the magnitude of the differential input voltage is at a level less than the predetermined threshold level; and (c) an output stage, fed by the output current provided by the first differential amplifier stage and passed to the first output or the second output of the second differential amplifier stage, for combining the output current provided by the first differential amplifier stage and current passed to the selected one of the first output or second output of the second differential amplifier stage into a composite output current.

3. In a differential amplifier of the type having:
(a) an input stage;
(b) a current mirror coupled to the input stage via a first and second leads wherein a positive input voltage increases the current in the first lead and a negative input voltage decreases the current in the first lead; and
(c) a gain stage connected via a third lead to the second lead wherein an increase in current in the first lead increases the flow of current in the third lead in the direction out of the gain stage and a decrease in current in the first lead increases the flow of current in the third lead in the direction into the gain stage, an improved slew rate enhancement circuit comprising:
  (i) means for producing a current in a fourth lead which is proportional to the amount the input voltage exceeds a threshold;
  (ii) means for producing a current in a fifth lead which is proportional to the amount the input voltage is less than the negative of the threshold;
  (iii) a first transistor switch connecting the fourth lead to the first lead, wherein the first switch conducts current when the input voltage exceeds the threshold; and
  (iv) a second transistor switch connecting the fifth lead to the second lead, wherein the second switch conducts current when the input voltage is less than the negative of the threshold.

4. The differential amplifier of claim 3 additionally comprising:
(a) a buffer stage having an input connected to the output of the gain stage for producing an output voltage in response to the current at its input; and
(b) means for producing an enhancing current in proportion to the amount the input voltage exceeds a threshold, wherein the enhancing current is applied to the input of the buffer stage.

5. The differential amplifier of claim 3 wherein the slew rate enhancement circuit additionally comprises means for producing a current in a sixth lead which is proportional to the amount the input voltage exceeds a threshold, wherein the current in the sixth lead is coupled to an output of the gain stage.

6. The differential amplifier of claim 3 additionally comprising:
(a) means for adjusting the offset voltage of the amplifier connected to the first and second leads.

* * * * *